United States Patent
Bohannon et al.

(10) Patent No.: US 8,797,764 B2
(45) Date of Patent: Aug. 5, 2014

(54) ADJUSTABLE RISER CAGE FOR VARYING LENGTH ADAPTERS

(75) Inventors: Mark Steven Bohannon, Research Triangle Park, NC (US); Jeremy Scott Bridges, Research Triangle Park, NC (US); Michael Dudley French, Jr., Research Triangle Park, NC (US); Daniel Paul Kelaher, Research Triangle Park, NC (US); Paul Jeffrey La Rocca, Research Triangle Park, NC (US); Derek Ian Schmidt, Research Triangle Park, NC (US)

(73) Assignee: International Business Machines Corporation, Armonk, NY (US)

( * ) Notice: Subject to any disclaimer, the term of this patent is extended or adjusted under 35 U.S.C. 154(b) by 532 days.

(21) Appl. No.: 13/102,907

(22) Filed: May 6, 2011

(65) Prior Publication Data
US 2012/0281373 A1    Nov. 8, 2012

(51) Int. Cl.
*H05K 7/02* (2006.01)
*H05K 7/04* (2006.01)

(52) U.S. Cl.
USPC .............................. 361/807; 361/756; 361/810

(58) Field of Classification Search
CPC ...... E21B 17/04; F16M 11/24; A63B 21/062; A61B 17/7082; H05K 7/1489; H05K 7/20445; H05K 7/2049; H05K 7/20509; H05K 7/20318
USPC ......... 361/728–730, 756, 758, 759, 807, 809, 361/810, 727, 741, 686, 802; 439/61, 65, 439/377, 374; 235/483
See application file for complete search history.

(56) References Cited

U.S. PATENT DOCUMENTS

| | | | |
|---|---|---|---|
| 5,706,173 A | 1/1998 | Carney et al. | |
| 6,256,191 B1 | 7/2001 | Curlee | |
| 6,356,457 B1 | 3/2002 | Haworth | |
| 6,667,890 B1 | 12/2003 | Barringer et al. | |
| 7,130,200 B1 | 10/2006 | Liu | |
| 7,140,900 B1 | 11/2006 | Villanueva | |
| 7,359,216 B2 * | 4/2008 | Hall | 361/796 |
| 7,381,081 B2 * | 6/2008 | Zhang et al. | 439/377 |
| 7,433,198 B2 | 10/2008 | Fan et al. | |
| 7,499,285 B2 | 3/2009 | Chen et al. | |
| 7,525,815 B2 * | 4/2009 | Chen et al. | 361/788 |
| 7,742,291 B2 | 6/2010 | Wu et al. | |
| 8,514,585 B2 * | 8/2013 | Zhang et al. | 361/796 |
| 2008/0037218 A1 | 2/2008 | Sharma et al. | |
| 2009/0067136 A1 | 3/2009 | Cheney et al. | |

* cited by examiner

*Primary Examiner* — Hung S Bui
(74) *Attorney, Agent, or Firm* — Matthew C. Zehrer; Jennifer Anda

(57) ABSTRACT

An adjustable riser cage retains varying length adapters. For example, the adjustable riser cage may support a short adapter card, a ¾ length adapter card, or a long adapter card. The adjustable riser cage includes a riser portion and an extension portion. The riser portion includes one or more guidance features and a plurality of first retention members. The extension portion is slide ably supported against only the one or more guidance members, and includes a second retention member configured to engage with a particular first retention member depending upon a length of the adapter card to be supported. The adjustable riser cage may be installed into a larger electronic system having a plurality of electronic components. The adjustable riser cage allows for increased access to the electronic components because the extension portion is not supported by external or non-integral support features that may block access to the electronic components.

20 Claims, 11 Drawing Sheets

ADJUSTABLE RISER CAGE FOR VARYING LENGTH ADAPTERS

FIELD OF THE INVENTION EMBODIMENTS

Embodiments of the present invention are generally related to mechanical packaging for electronic systems and to an adjustable riser cage configured to retain varying length adapter cards.

SUMMARY

Further embodiments of the present invention are generally directed to an adjustable riser cage configured to retain varying length adapter cards, a design structure tangibly embodied in a machine readable storage medium for designing or manufacturing an adjustable riser cage configured to retain varying length adapter cards, and a method of providing an adjustable riser cage configured to retain varying length adapter cards.

In certain embodiments the adjustable riser cage includes a riser portion and an extension portion. The riser portion includes one or more guidance features and a plurality of first retention members. The extension portion is slide ably supported against only the one or more guidance members, and may include a second retention member configured to engage with a particular first retention member depending upon a length of an adapter card.

In various embodiments the adjustable riser cage may be installed into a larger electronic system having a plurality of electronic components. The adjustable riser cage allows for increased access to the electronic components since the extension portion is slide ably supported against only the riser portion. In other words, there are no other supporting features that are external or non-integral to the adjustable riser cage that may block access to the other electronic components. For example, the extension portion is not fastened to or engaged with an electronic system chassis by a separate or non-integral bracket.

These and other embodiments, features, aspects, and advantages will become better understood with reference to the following description, appended claims, and accompanying figures.

BRIEF DESCRIPTION OF THE FIGURES

So that the manner in which the above recited features of the present invention embodiments are attained and can be understood, a more particular description, briefly summarized above, may be had by reference to the various embodiments thereof which are illustrated in the appended figures.

It is to be noted, however, that the appended figures illustrate only typical embodiments of this invention and are therefore not to be considered limiting of its scope, for the invention may admit to other equally effective embodiments.

DETAILED DESCRIPTION OF THE EMBODIMENTS

The descriptions of the various embodiments of the present invention are presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Figure 1:
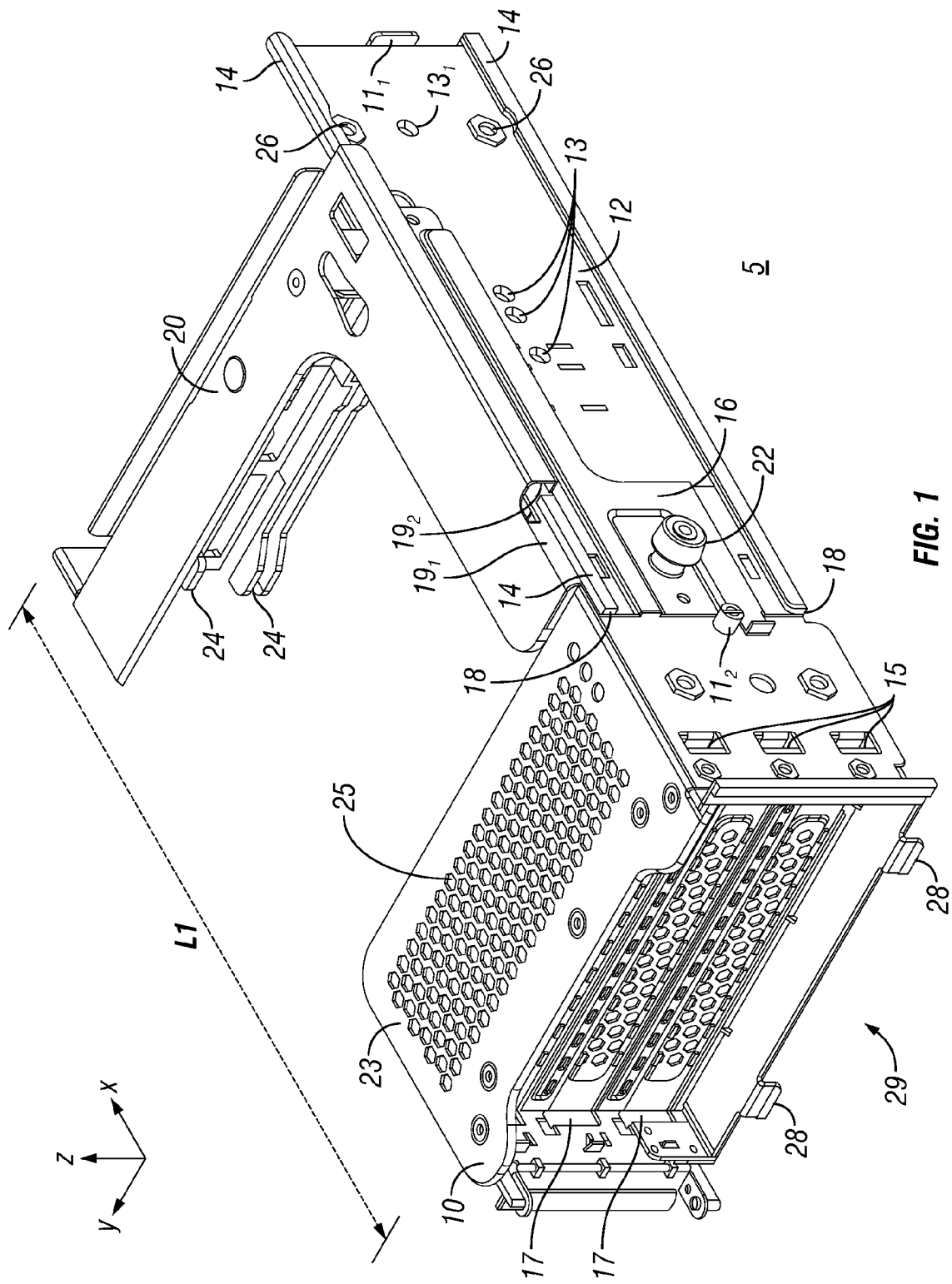
FIGS. 1-4 depict various views of an adjustable riser cage for varying length adapters, according to various embodiments of the present invention.
Figure 2:
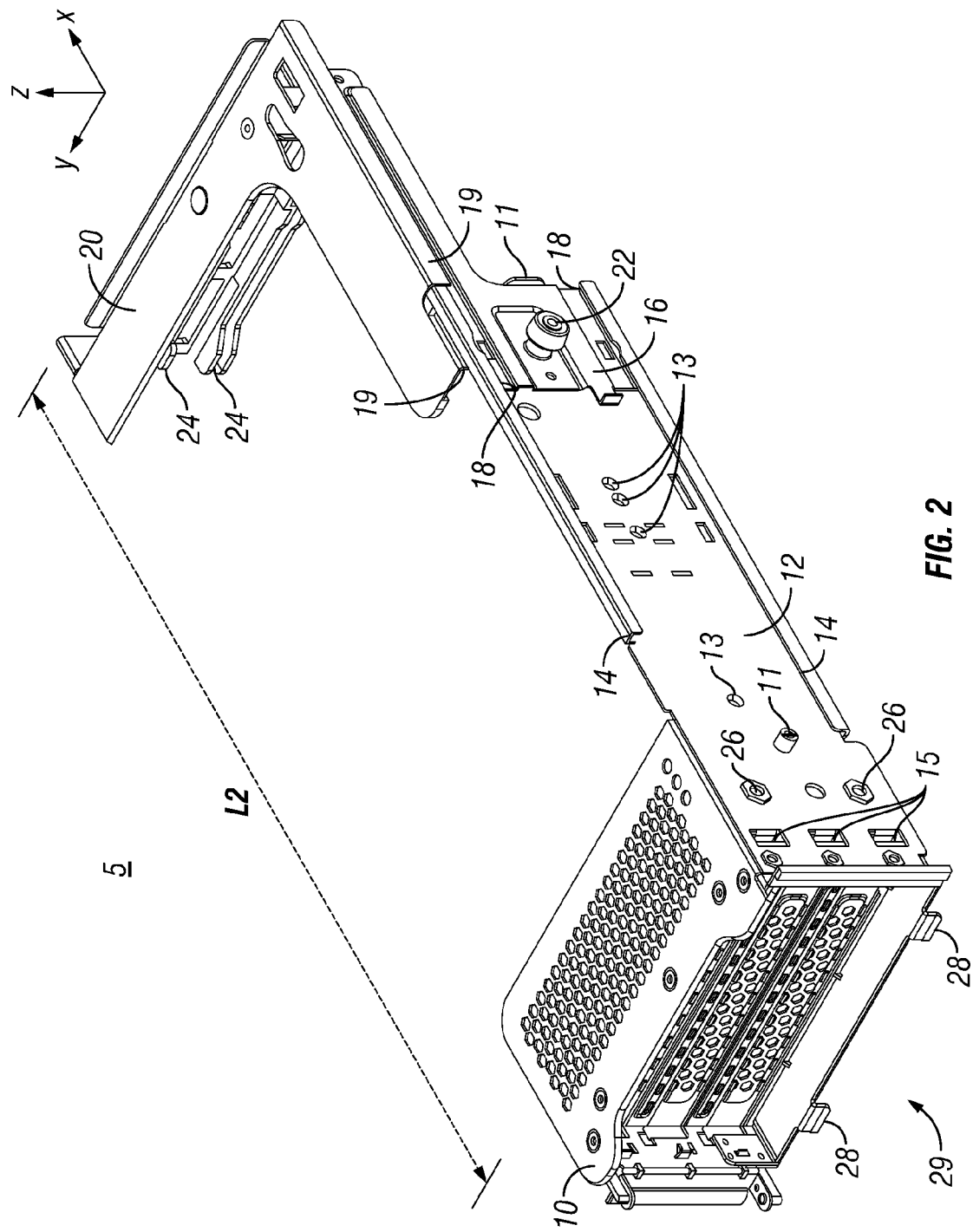
Figure 3:
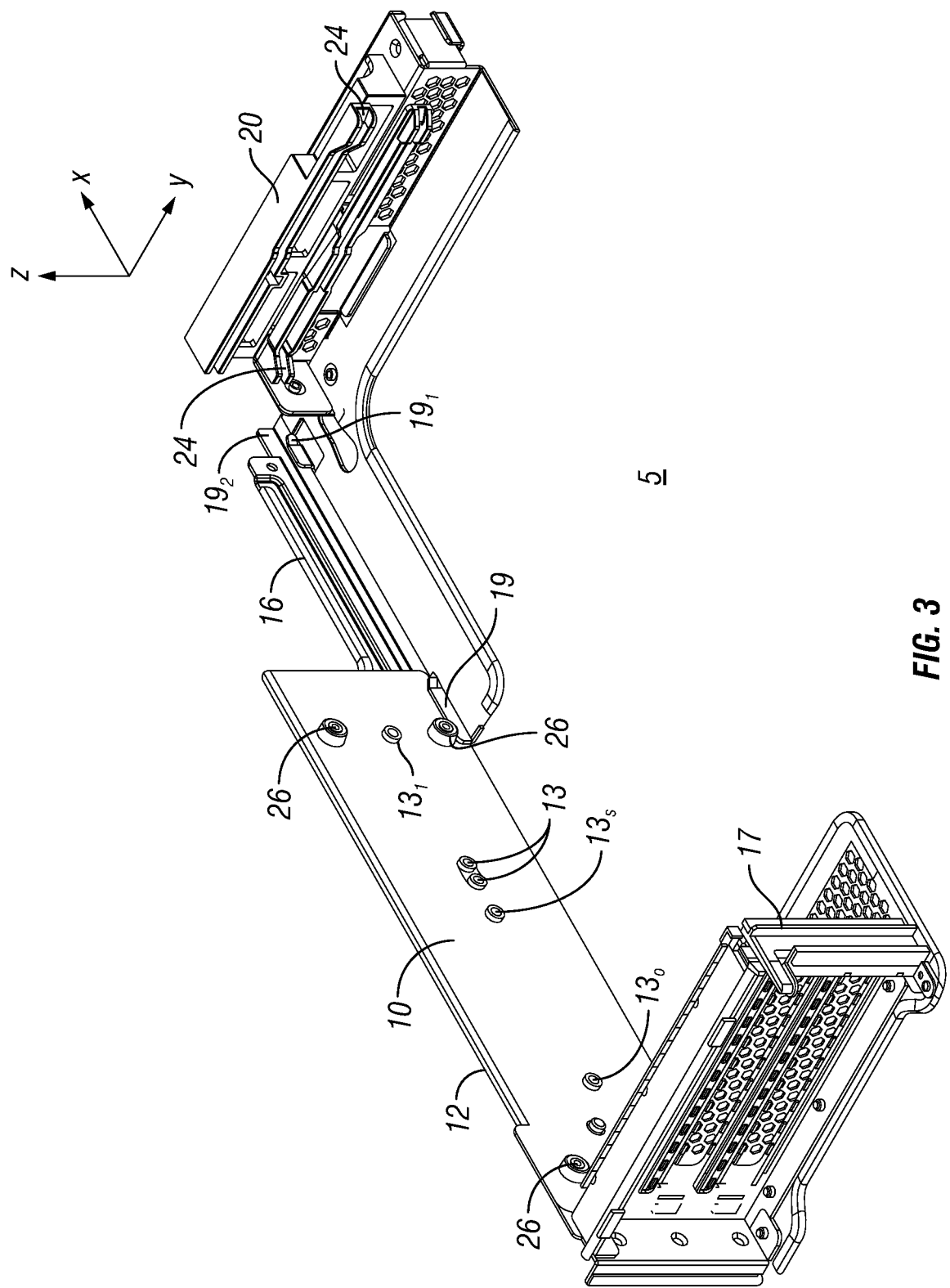
Figure 4:
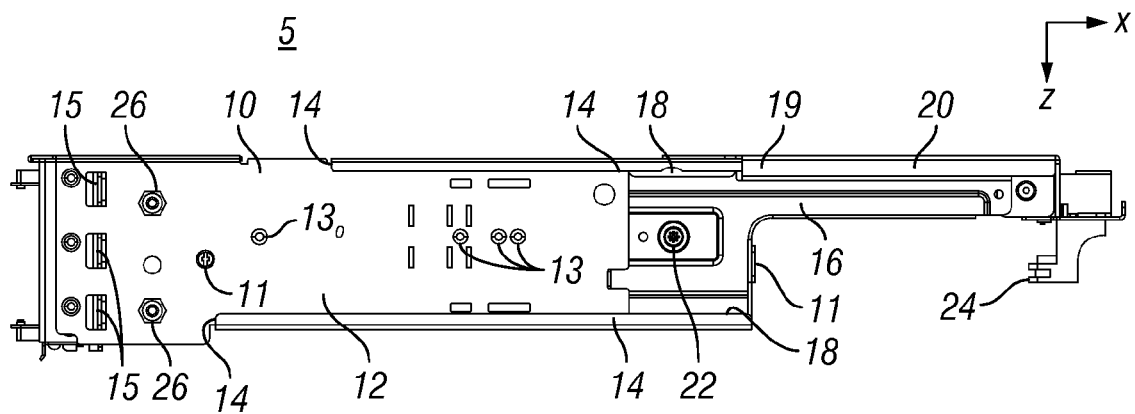

Various embodiments of the present invention are more readily understood by reference to the FIGS. 1-4 wherein like reference numerals indicate like elements. FIGS. 1-4 depict various views of an adjustable riser cage 5 for varying length adapters. FIG. 1 depicts an isometric view of an adjustable riser cage 5 in a short 'L1' length adapter card configuration, FIG. 2 depicts an isometric view of adjustable riser cage 5 in a long 'L2' length adapter card configuration, FIG. 3 depicts an alternative isometric view of adjustable riser cage 5 in a long length adapter card configuration, and FIG. 4 depicts a base view of adjustable riser cage 5 in a long length adapter card configuration.

Adjustable riser cage 5 mechanically retains, houses, or otherwise supports varying length adapter cards. For example, adjustable riser cage 5 may be configured or adjusted to support one or more adapter cards of a first length and/or one or more adapter cards of a second length, etc.

In a particular embodiment, adjustable riser cage 5 includes a riser portion 10 and an extension portion 20. Extension portion 20 is slide ably supported by riser portion 10. Extension portion 20 may slide against riser portion 10 to a particular location wherein extension portion 20 may engage with riser portion 10. Extension portion 20 then becomes generally fixed relative to riser portion 10. There may be numerous particular locations where extension portion 20 may engage with riser portion 10—thereby allowing adjustable riser cage 5 to mechanically support, house, or otherwise retain varying length adapter cards.

In various embodiments, riser portion 10 may include one or more guidance features 14 and a plurality of retention members 13. Guidance feature 14 allows for extension portion 20 to be slide ably supported against riser portion 10 such that movement of extension portion 20 against riser portion 10 is generally restrained, limited, or otherwise restricted in two dimensions but allowed in a third dimension. For example, the one or more guidance features 14 limit extension portion 20 movement against riser portion 10 in the y-direction and z-direction but allows for extension portion 20 to slide against riser portion 10 in the x-direction. In various embodiments, guidance feature 14 may be, for example, a guide, rail, slot, channel, pathway, etc.

Retention member 13 allows for extension portion 20 movement in the third dimension to be restrained, limited, or otherwise restricted when retention member 13 is engaged with retention member 22. Therefore, when retention member 22 and retention member 13 are engaged, extension portion 20 becomes generally fixed or otherwise attached relative to riser portion 10. In certain embodiments, riser portion 10 may include multiple retention members 13 in various locations. Therefore extension portion 20 may be fixed relative to riser portion 10 at differing locations as may be desired—thereby allowing adjustable riser cage 5 to mechanically support, house, or otherwise retain varying length adapter cards. In various embodiments, retention member 13 may be for example a threaded punch through hole, a self-clinching nut, a broaching nut, a flaring nut, surface mount nut, a weld nut, a pressed in nut, a hole, tab, a slot, etc.

Extension portion 20 is slide ably supported against riser portion 10 and includes a retention member 22 that is configured to engage with a particular retention member 13 depending upon a length of an adapter card that adjustable riser cage 5 is to mechanically support, house, or otherwise retain. If the adapter card is short, retention member 22 may be engaged with the appropriate retention member (e.g. retention member 13s shown for example in FIG. 3, etc.). If the adapter card is long, retention member 22 may be engaged with the appropriate retention member (e.g. retention member 13l shown for example in FIGS. 1 and 3, etc.). Other retention members 13 may be placed in locations for adjustable riser cage 5 to accommodate, for example, a ½ length or ¾-length adapter cards. In various embodiments, retention member 22 may be for example a screw, a captive panel screw, a clinch bolt, a latch, a low-profile latch, a spring latch, a pin, spring-pin, a tab, etc.

Figure 5:
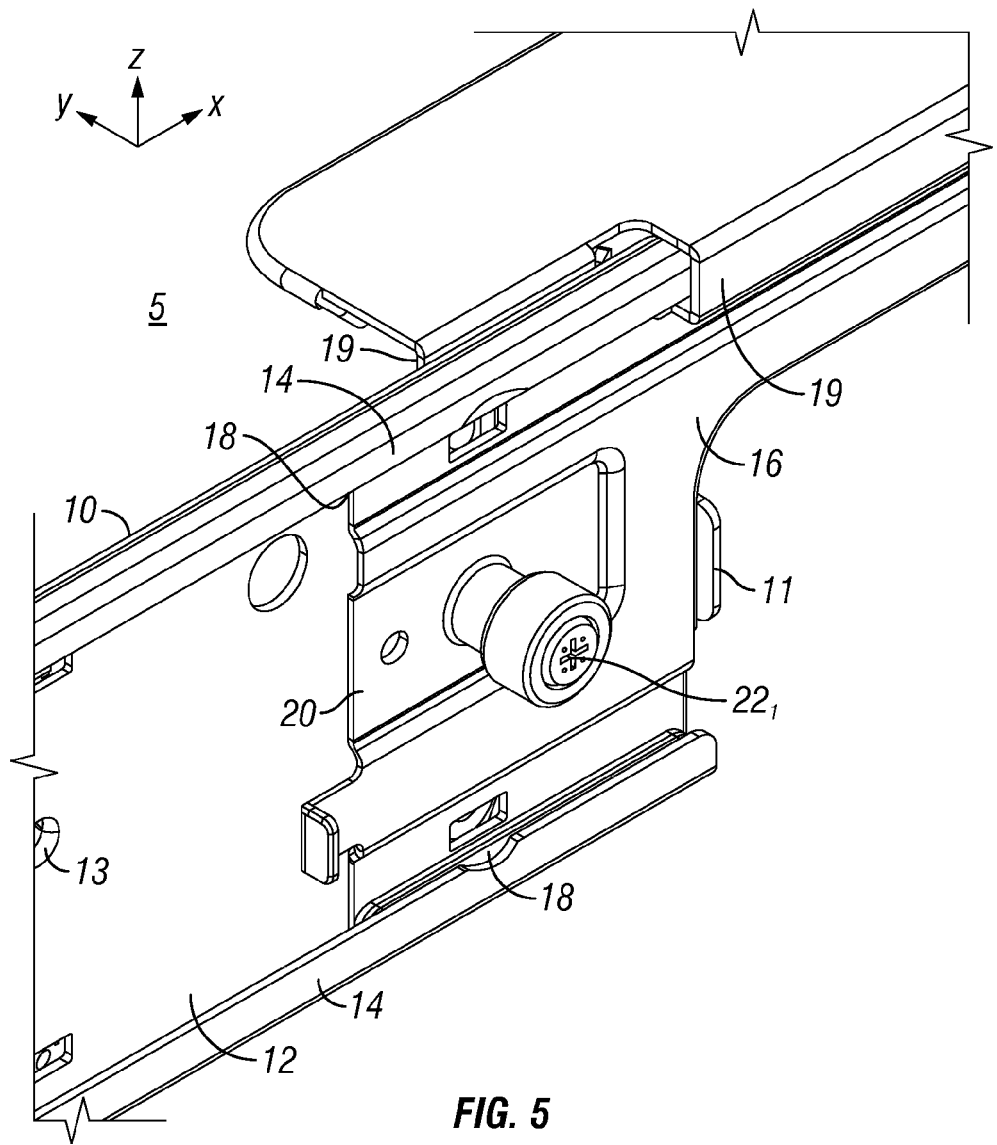
FIGS. 5 and 6 depict magnified views of portions of an adjustable riser cage for varying length adapters, according to various embodiments of the present invention.
Figure 6:
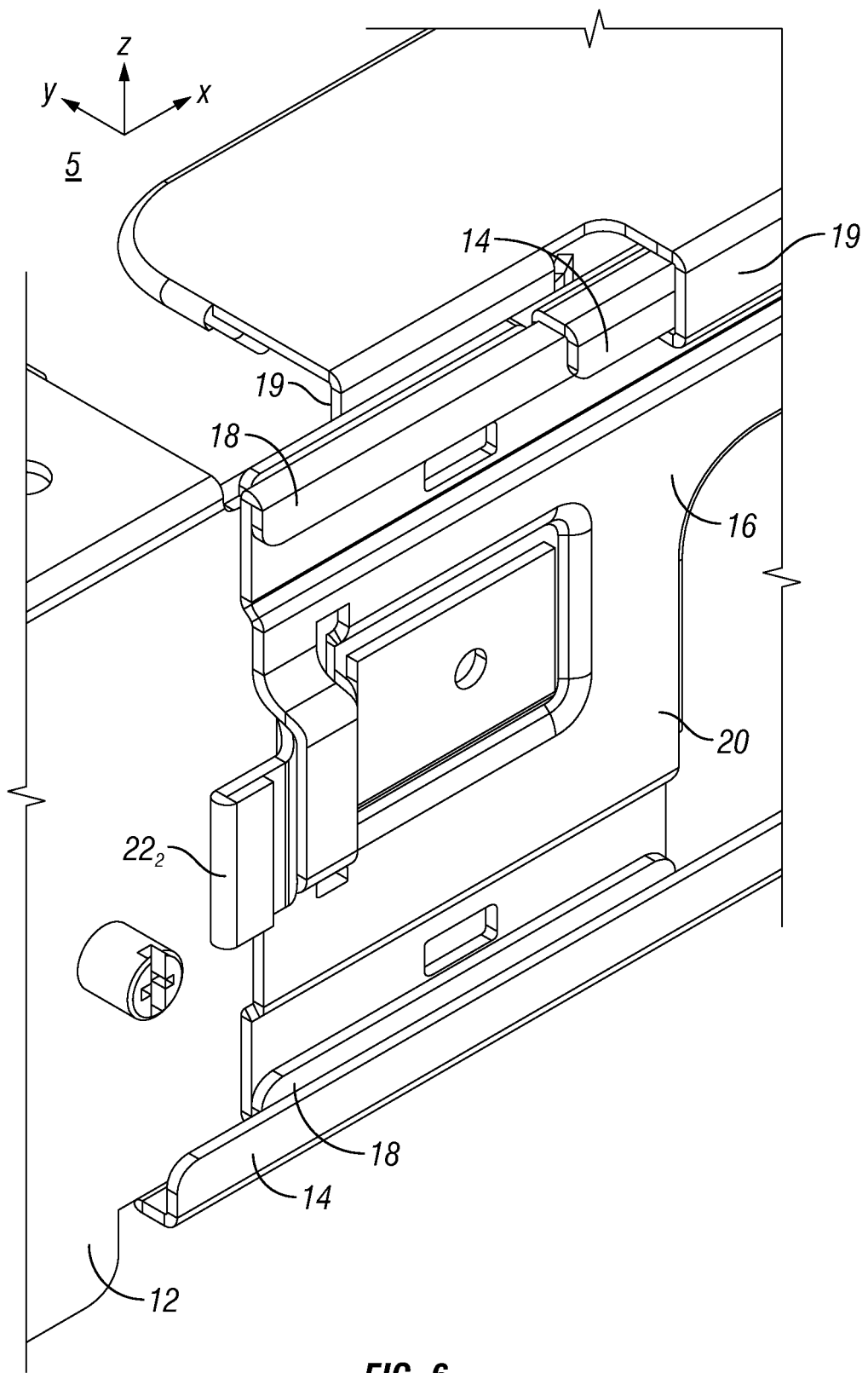

In particular embodiments, the style of retention member 13 and the style of retention member 22 are selected so that retention member 22 may effectively engage with retention member 13. For example, the following retention member 13, retention member 22 pairs may be appropriate: (threaded punch through hole, screw), (self-clinching nut, captive panel screw), (self-clinching nut, clinch bolt), (hole, tab), (hole, spring-pin), (slot, tab), (slot, latch), (tab, slot), etc. Particular examples of retention member 22 styles are shown in FIGS. 5 and 6.

In various embodiments, riser portion 10 may further include a riser base 12 that provides mechanical support to a riser card 50. Riser base 12 may include one or more stops 11, one or more adapter tailstock foot engagement features 15, one or more adapter tailstock head engagement features 17, a plurality of riser card mounts 26, riser side 23, perforations 25, electronic computer system engagement feature 28, and/or an exterior surface 29.

In some embodiments, guidance features 14 may be made from folding one or more edges of riser base 12 to create a pathway (e.g. rolled edge, c-shape fold, channel, etc.). In particular embodiments riser base 12 is made from sheet metal. In particular embodiments, base 12 is configured to support riser card 50 so that riser card 50 may be substantially parallel with guidance features 14.

One or more stop 11 features may be utilized to ensure that extension portion 20 does not slide apart from riser portion 10 unintentionally. Stop 11 may be, for example, a folded tab 111 (shown for example in FIG. 1) made from riser base 12 material or an fastener stop 112 (e.g. screw, etc.) (shown for example in FIG. 1) that may be fastened to riser base 12 after extension portion 20 is installed to or is otherwise slide ably supported by riser portion 10.

Tailstock foot engagement features 15 retain a foot 62 of one or more adapter card tailstocks from movement in, for example, the z-direction. Tailstock foot engagement features 15 may also aid in adapter card guidance or alignment during insertion to the adjustable riser cage 5. In particular embodiments, tailstock foot engagement features 15 may be holes, slots, or cutouts of riser base 12.

Tailstock head engagement features 17 retain a head 64 of one or more adapter card tailstocks from movement in, for example, the y-direction. Tailstock head engagement features 17 may be engaged after the adapter card is inserted into the adjustable riser cage 5. The tailstock head engagement feature 17 may be attached to riser portion 10 and engaged with the adapter card tailstock subsequent to adapter card insertion. In particular embodiments, tailstock foot engagement features 15 may be a bracket, hinged bracket, clip, rotating clip, clasp, etc.

Riser portion 10 may include a riser side 23 that may be connected to riser base 12. Riser side 23 may form a portion of the overall exterior surface of an electronic system when adjustable riser cage 5 is inserted into the electronic system. In certain embodiments, riser side 23 is substantially perpendicular to exterior surface 29. Riser side 23 may also include one or more perforations 25 that allow for air flow through adjustable riser cage 5, cooling the one or more adapter cards, and for hot air to escape the electronic system during operation.

Riser card mounts 26 are fixedly attached to riser portion 10 (e.g. press fit into riser base 12, etc.) and allow for a riser card to be attached to riser portion 10. In particular embodiments, riser card mounts 26 may bored threaded standoffs, blind threaded rivets, self-clinching standoffs, blind threaded standoffs, pressed in nut, self clinching nut, etc. For example, a riser card may be attached to adjustable riser cage 5 by fastening a screw through an adapter card through hole into a blind threaded self clinching standoff style riser card mount 26.

Electronic computer system engagement feature 28 generally align adjustable riser cage 5 with the electronic system during installation by engaging with a corresponding accepting feature in the electronic system. For example, electronic computer system engagement feature 28 may be tab style that fit into slots in a chassis of the electronic system. Electronic computer system engagement feature 28 may ensure that adjustable riser cage 5 is installed in the correct location in the electronic system. Further, electronic computer system engagement feature 28 may contact and ground adjustable riser cage 5 to the electronic system when the adjustable riser cage 5 is installed into the electronic system. Riser portion 10 may also include an exterior surface 29 that forms a portion of the overall exterior surface of the electronic system.

In various embodiments, extension portion 20 may further include an extension base 16, one or more inner guidance feature 18, one or more extension guidance features 19, and/or one or more adapter edge engagement features 24.

In certain embodiments, extension base 16 is configured to fit within guidance features 14. In this manner, extension base 16 becomes slide ably supported against riser portion 10. For example a first edge of extension base 16 fits within the pathway of a first guidance feature 14. In certain embodiments, a second edge of extension base 16 fits within the pathway of a second guidance feature 14.

In certain embodiments, an edge of extension base 16 may be folded and hemmed against the extension base 16, creating inner guidance feature 18. Inner guidance feature 18 has relatively smooth surfaces along its length and fits within a guidance feature 14. The realitvely smooth surface allows for less friction between the inner guidance feature 18 and guidance feature 14. Inner guidance feature therefore may allow for extension portion 20 to slide easier against riser portion 10.

Extension portion 20 may also include an extension guidance feature 19. Extension guidance feature 19 may also slide ably support extension portion 20 against riser portion 10. Guidance features 19 slid ably support extension portion 20 by forming a guidance slot, channel, pathway, etc. for riser base 10. For example, extension portion 10 may be slid ably supported against riser portion 10 by inserting riser base 10 in a guidance pathway formed by upper tab 191 and lower tab 192 style extension guidance features 19. Upper tab 191 and lower tab 192 ensi are shown for example in FIG. 3 and FIG. 10.

Effectively, multiple guidance levels, slots, channels, pathways, etc. may be created with the use of differing guidance features. For example, a first guidance pathway may be formed by guidance features 14 forming a pathway, channel, etc. for which extension base 16 may be slide ably supported. A second guidance pathway may be formed by guidance features 19 forming a pathway, channel, etc. for which riser base 12 may be slide ably supported. In certain embodiments, the first guidance pathway may be the only pathway, channel, etc. used to slide ably support extension portion 20 against riser portion 10. In other embodiments, the second guidance pathway may be the only pathway, channel, etc. used to slide ably support extension portion 20 against riser portion 10.

Extension portion 20 may also include one or more adapter edge engagement features 24. Adapter edge engagement features 24 include a guidance pathway, channel, guide, slot, etc. for which for which an edge of an adapter may be inserted, allowing for adapter card guidance during installation into adjustable riser cage 5.

In particular embodiments, extension portion 20 may be engaged with riser portion 10 at a particular location such that, when inserted into adjustable riser cage 5, at least one adapter card engages with adapter tailstock foot engagement feature 15, adapter tailstock head engagement feature 17, and adapter edge engagement feature 24. Therefore, adapter edge engagement features 24, along with adapter tailstock foot engagement feature 15, adapter tailstock head engagement feature 17, may effectively restrain, limit, or otherwise restrict the movement of the adapter card in three dimensions. In this manner, adjustable riser cage 5 mechanically retains, houses, or otherwise supports the adapter card.

Various embodiments of the present invention are more readily understood by reference to the FIGS. 5-6 wherein like reference numerals indicate like elements. As described herein, there may be different styles of retention member 22 (e.g. screw, a captive panel screw, a clinch bolt, a latch, a low-profile latch, a spring latch, a pin, spring-pin, a tab, etc.). FIG. 5 depicts a magnified view of portions of adjustable riser cage 5 including a captive panel screw 221 style retention member 22. FIG. 6 depicts a magnified view of portions of adjustable riser cage 5 including a latch 222 style retention member 22.

A captive panel screw 221 may engage with an appropriate retention member 13 (e.g. a self-clinching nut, etc.) by sliding the extension portion 20 to a proper location and rotating a thumb screw portion about the y-axis thereby engaging a tread into the appropriate retention member 13. A latch 222 may engage with an appropriate retention member 13 (e.g. slot, etc.) by forcing the latch 222, for example, in the −y direction, sliding the extension portion 20 to the proper location, and releasing the latch 222 thereby engaging the latch 222 into the appropriate retention member 13.

Figure 7:
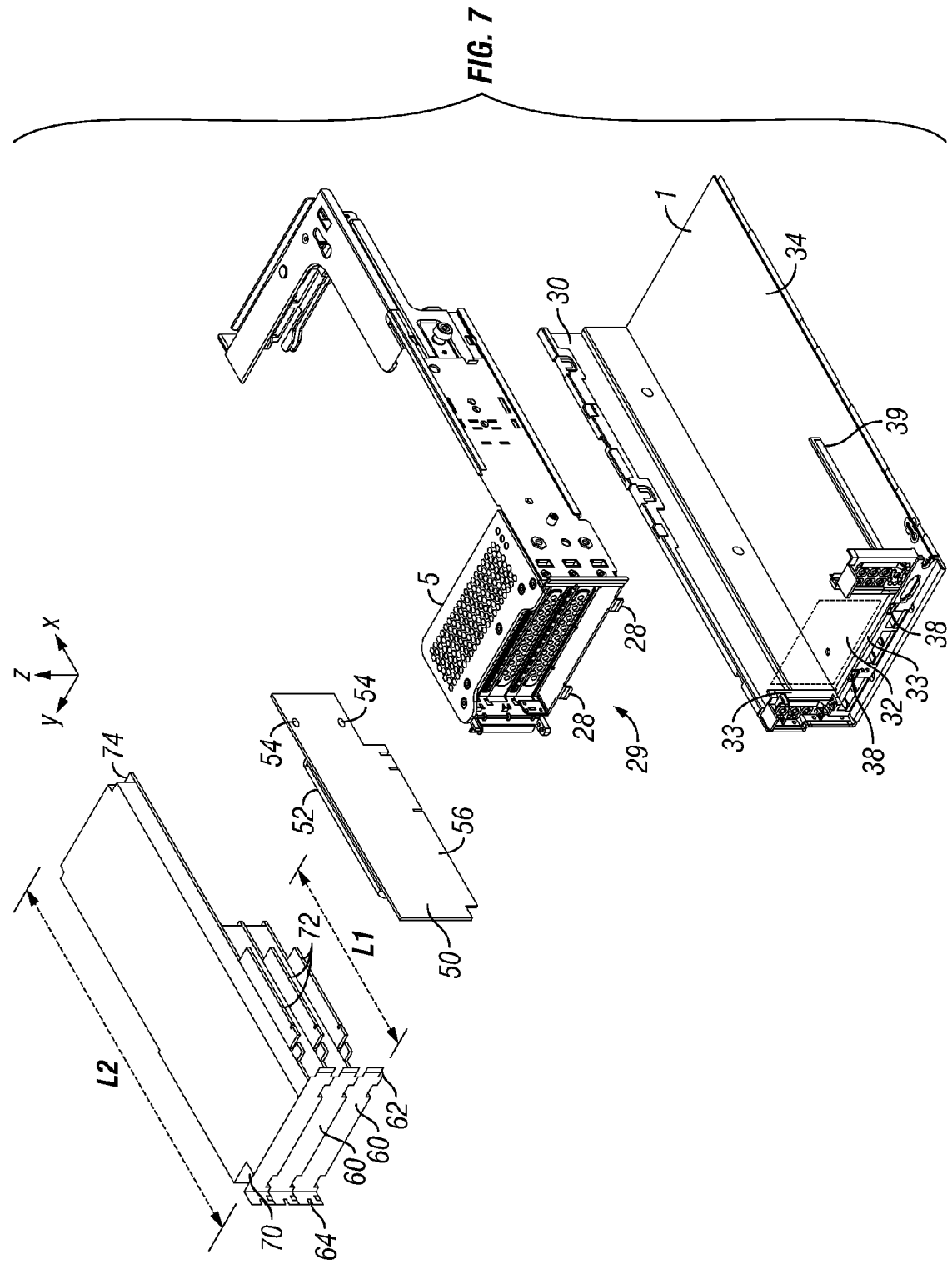
FIG. 7 depicts an exploded view of an electronic system and an adjustable riser cage for varying length adapters, according to various embodiments of the present invention.

FIG. 7 depicts an exploded view of an electronic system 1 and adjustable riser cage 5 assembly according to various embodiments of the present invention.

A riser card 50 may be inserted and attached to adjustable riser cage 5. Riser card 50 may include one or more adapter connectors 52, one or more through holes 54, and at least one mother board connector 56. Riser card 50 may be attached to adjustable riser cage 5, for example, by inserting one or more fasteners into through holes 54 and engage the fasteners with, for example, riser card mounts 26. Adapter connectors 52 allow for one or more adapter cards to attach to riser card 50 and mother board connector 56 allows for the riser card 50 to attach to a mother board 34.

Depending upon a length (e.g. L1, L2, etc.) of at least one adapter card, extension portion 20 is slid against riser portion 10, whereby retention member 22 may engage with a particular retention member 13. For example, long adapter card 70 and two short adapter cards 60 are to be inserted into adjustable riser cage 5. Extension portion 30 is slid against riser portion 10 and retention member 22 is engaged with retention member 13*l*.

Long adapter 70 may be inserted into adjustable riser cage 5. During installation adapter tailstock foot engagement feature 15 may guide tailstock foot 62 of long adapter 70 and/or adapter edge engagement feature 24 guiding adapter edge 74. The two short adapter cards 60 may also be inserted into adjustable riser cage 5 (adapter tailstock foot engagement feature 15 may also guide tailstock foot 62 of short adapters 60, etc.). The long adapter 70 and the short adapters 60 engage with riser card 50 when riser connectors 72 are inserted into adapter connectors 52, respectively. After the long adapter 70 and the short adapters 60 are inserted into adjustable riser cage 5, adapter tailstock head engagement features 17 for example, may engage with tailstock heads 64 thereby allowing for adjustable riser cage 5 to mechanically retain, house, or otherwise support the adapter cards.

Short adapter card 60 and long adapter card 70 (e.g. expansion board, I/O card, accessory card, etc.) may be a printed circuit board that may be inserted into a connector of a motherboard 34 to add functionality to the electronic system 1. In various embodiments, though only a short adapter card 60 and a long adapter card 70 are shown, ½ length or ¾ length adapter cards may also be to mechanically retained, housed, or otherwise supported by adjustable riser cage 5.

In particular embodiments, the one or more adapter cards mechanically retained, housed, or otherwise supported by adjustable riser cage 5 are substantially parallel with a motherboard 34. In still other embodiments, no adapter cards are mechanically retained, housed, or otherwise supported by adjustable riser cage 5. When no adapter cards are supported, blockage of critical mother board 34 areas may be minimized by engaging retention member 22 to retention member 13*o* (shown for example in FIGS. 4 and 5). If a customer later decides to add an adapter card, adjustable riser cage 5 may be removed from electronic system 1, extension portion 20 may be adjusted, the adapter card may be inserted, retained, etc., and the adjustable riser cage 5 may be re-inserted into electronic system 1.

Electronic system 1 may be, for example, a computer, a server, blade server, 1U server, 2U server, or any other such electronic device that may operate under the control of instructions stored in its memory, accept data, process data according to specified rules, produce results, and/or store the results for later use. Therefore in various embodiments, electronic system may include system memory, one or more processing units, one or more power supplies, etc.

Electronics system 1 may also include a chassis 30, a chassis opening 32, one or more opening flanges 33, a mother board 34, one or more riser cage engagement features 38, and a riser connector 39. Chassis 30 is an enclosure that houses most of the components of electronic system 1 and may be, for example, a cabinet, box, tower, enclosure, housing, system unit, case, etc. Chassis 30 may also include a chassis opening 32 that allows for exterior surface 29 of adjustable riser cage 5 to be exposed or otherwise assessable. Chassis opening may be formed by creating one or more opening flanges 33 that may guide and engage adjustable riser cage 5 during insertion and use. One or more riser cage engagement features 38 may be included to align and engage with electronic computer system engagement feature 28 of adjustable riser cage 5 to ensure that adjustable riser cage 5 is correctly located in electronic system 1. Motherboard 34 may be a printed circuit board and may support many of the electronic system 1 components and may be, for example, a main board, system board, logic board, etc. In various embodiments, after the components of electronic system 1 are installed, a cover may be attached to chassis 30.

Figure 8:
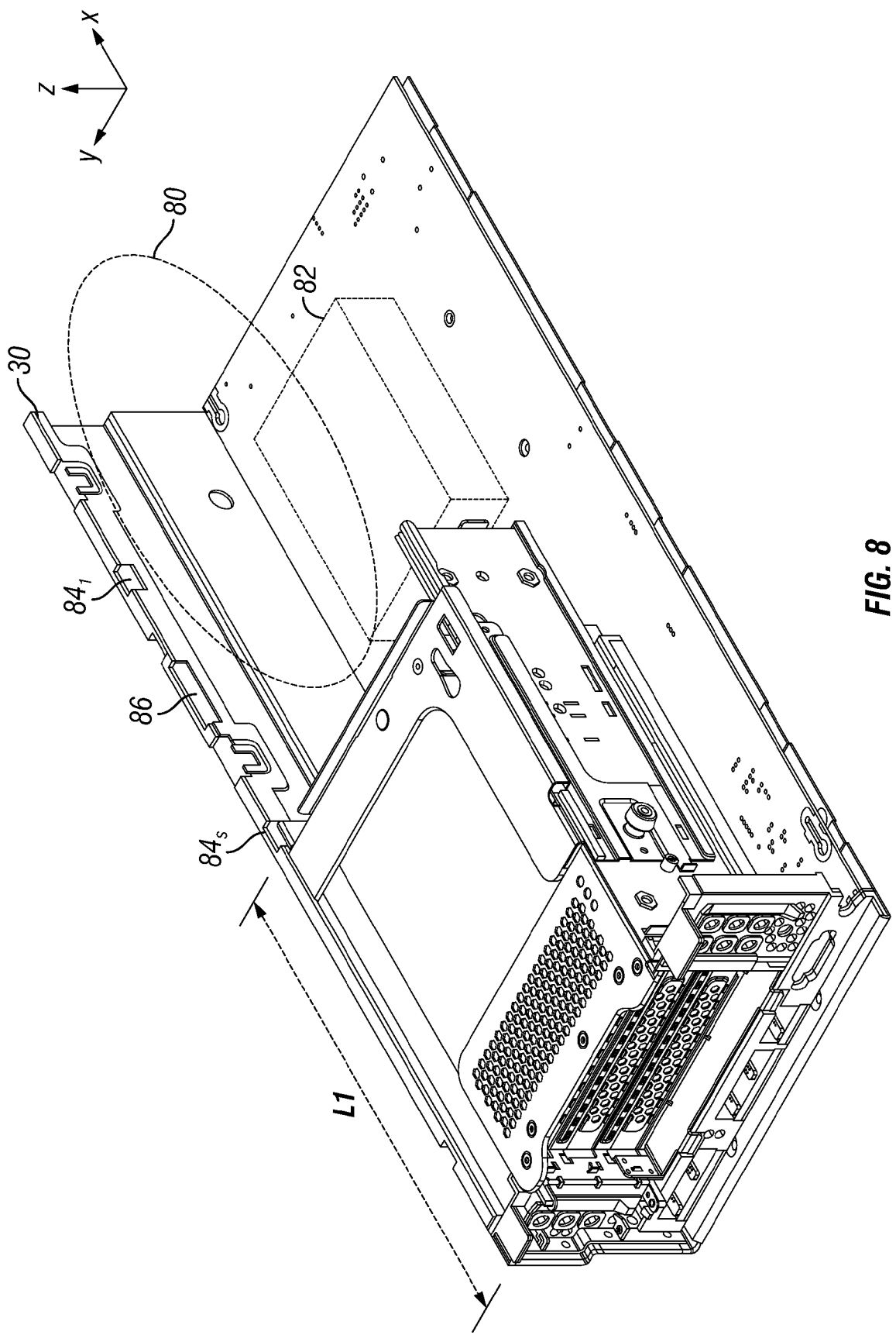
FIGS. 8 and 9 depict assembled views of an electronic system and an adjustable riser cage for varying length adapters, according to various embodiments of the present invention.
Figure 9:
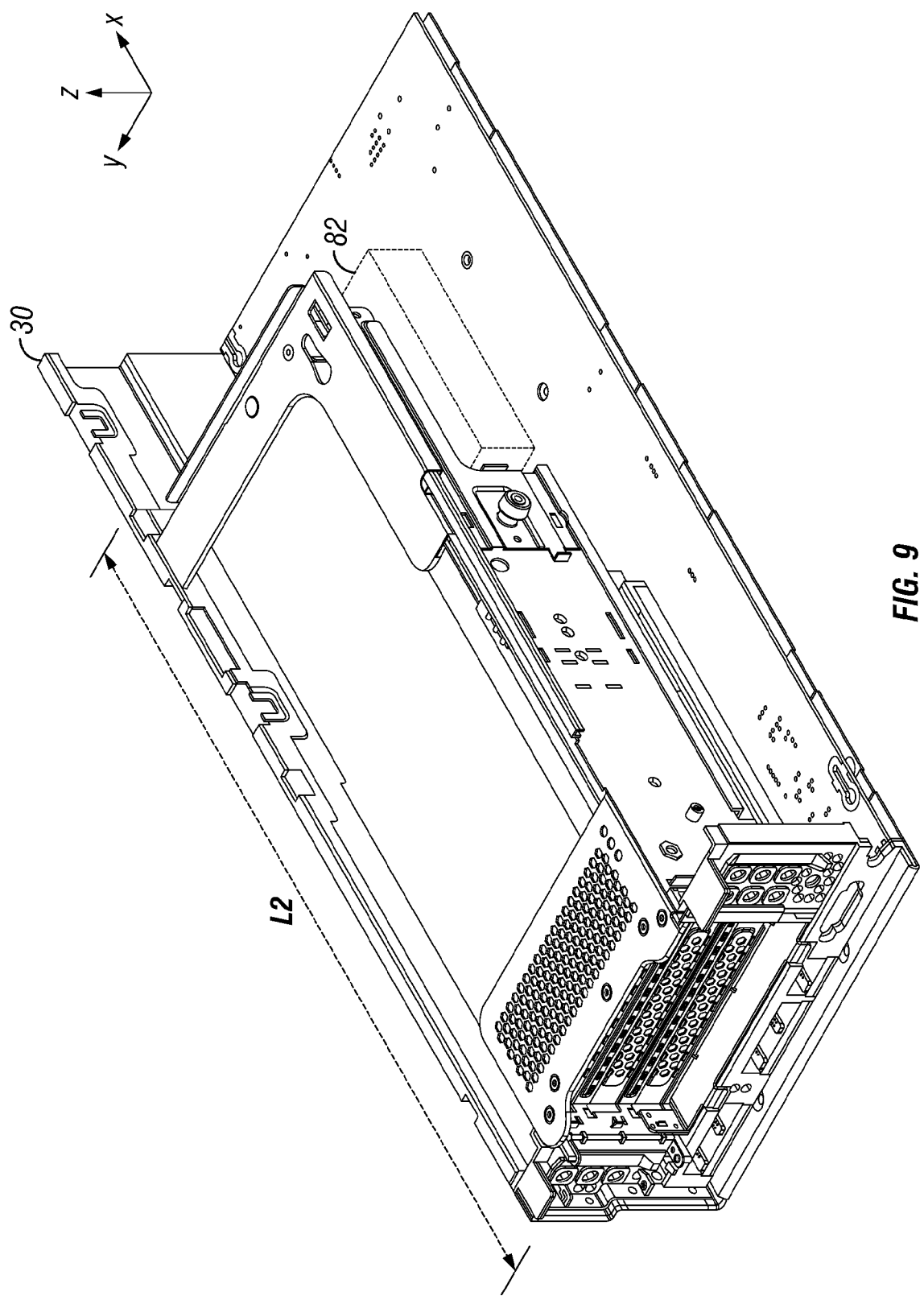

Various embodiments of the present invention are more readily understood by reference to the FIGS. 8-9 wherein like reference numerals indicate like elements. FIG. 8 depicts an assembled view of electronic system 1 and adjustable riser cage 5 in a short length adapter card configuration. FIG. 9 depicts an assembled view of electronic system 1 and adjustable riser cage 5 in a long length adapter card configuration.

Electronic system 1 may also include electronic component(s) 82 that are exposed (e.g. area 80 is unblocked, etc.) when adjustable riser cage 5 mechanically retains, houses, or otherwise supports a short adapter card 60 or no adapter cards. However portions of extension portion 20 and/or long adapter card 70 may cover electronic component(s) 82 when adjustable riser cage 5 mechanically retains, houses, or otherwise supports a long adapter card 70.

Electronic component(s) 82 may be one or more components that need handling relatively more than other electronic system 1 components. Therefore allowing greater access to electronic component(s) 82, when possible, is desirable. Adjustable riser cage 5 allows for increased access to electronic component(s) 82 since extension portion 20 is slide ably supported against only riser portion 10. In other words, there are no supporting features external or connected to adjustable riser cage 5 (i.e. that may block access to electronic component(s) 82). For example, an external bracket is not connected to extension portion 20 and to chassis 30. Therefore no other external connecting or supporting features connect with or otherwise support extension portion 20 in an area 80 that may block access to electronic component(s) 82.

In certain embodiments chassis 30 may include extension portion engagement 84 and/or extension portion engagement 86. Extension portion engagement 84 may be used to engage with a chassis engagement feature 88 described further below. Extension portion engagement 84 is substantially the same length in the x-direction as chassis engagement feature 88. Extension portion engagement 86 is a greater length in the x-direction as chassis engagement feature 88 and allows for engagement in various adapter length configurations (e.g. ½ length card, ¾ length card, etc.). In various embodiments extension portion engagement 84 and extension portion engagement 86 may be a slot, etc.

Figure 10:
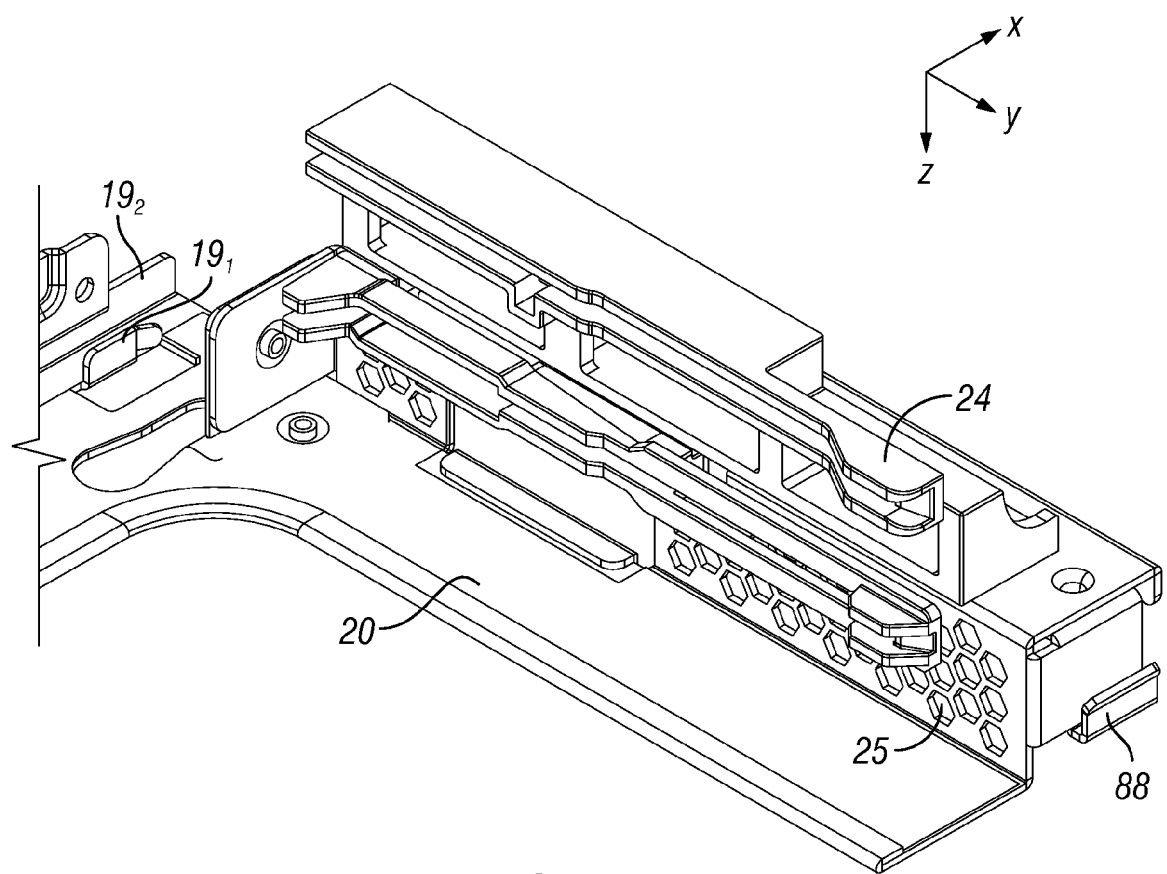
FIG. 10 depicts a magnified view of portions of an adjustable riser cage for varying length adapters, according to various embodiments of the present invention.

FIG. 10 depicts a magnified view of portions of an adjustable riser cage 5 for varying length adapters, according to various embodiments of the present invention. In certain embodiments extension portion 20 may further include a chassis engagement feature 88. Chassis engagement feature 88 engages with either extension portion engagement 84 or extension portion engagement 86 and may thereby be supported or retained, for example in the negative z-direction, by chassis 30. Chassis engagement feature 88 is a feature integral to extension portion 20. In various embodiments chassis engagement feature 88 may be a tab, folded edge, rolled edge, fixedly attached latch, etc.

Figure 11:
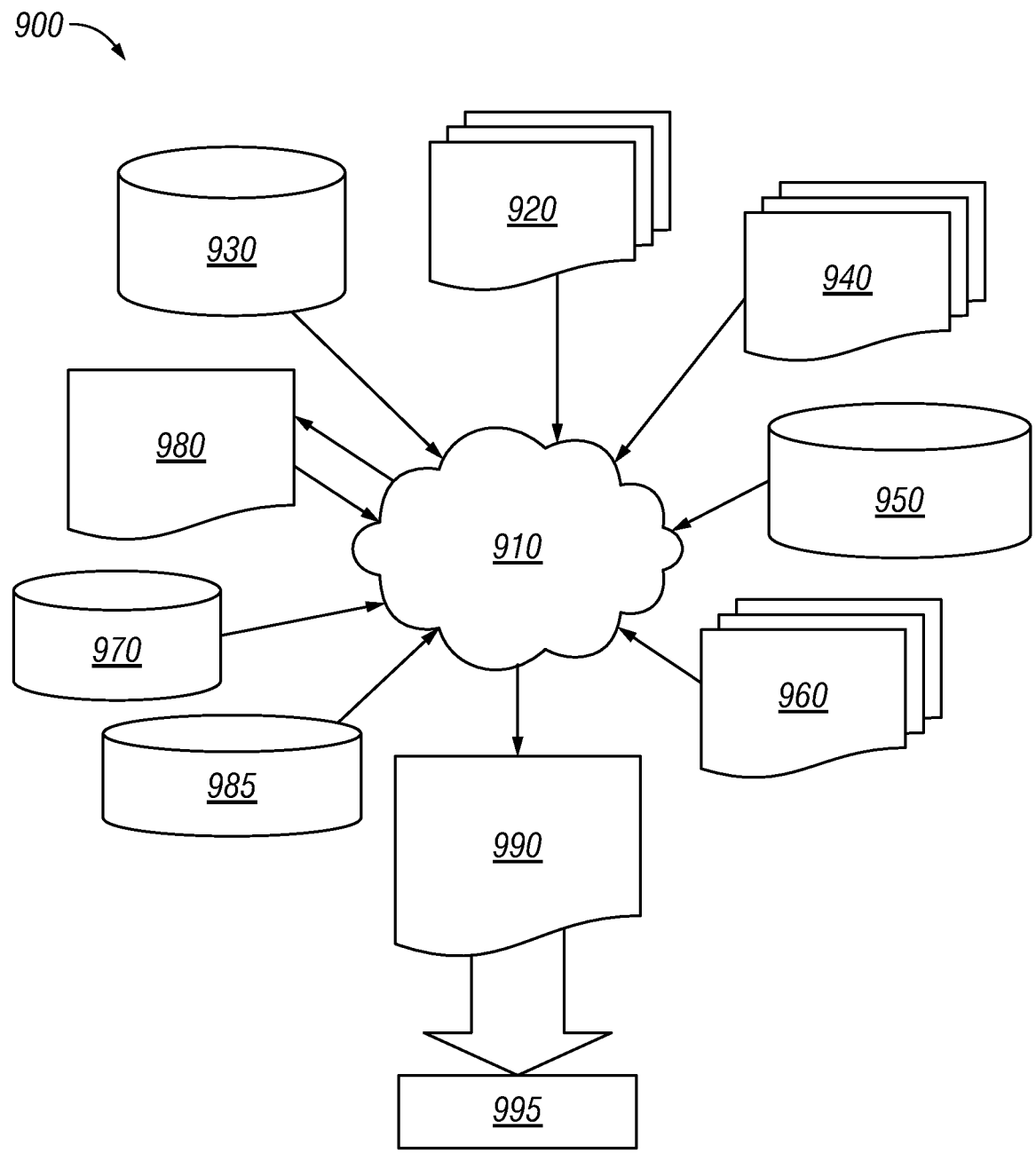
FIG. 11 depicts a block diagram of an exemplary design flow used for example, in computer aided design, simulation, test, layout, and/or manufacture of an adjustable riser cage for varying length adapters.

FIG. 11 shows a block diagram of an exemplary design flow 900 used for example, in computer aided design, simulation, test, layout, and manufacture. Design flow 900 includes processes, machines and/or mechanisms for processing design structures or devices to generate logically or otherwise functionally equivalent representations of devices described above and shown in FIGS. 1-10. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware, mechanical, device, assembly, component, or system.

FIG. 11 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD). When encoded on a machine-readable storage medium, design structure 920 may be accessed and processed by one or more hardware and/or software modules within design process 910 to simulate or otherwise functionally represent the devices described above and shown in FIGS. 1-10. As such, design structure 920 may comprise files or other data structures including human and/or machine-readable source code, compiled structures, and computer-executable code structures that when processed by a design or simulation data processing system, functionally simulate or otherwise represent the devices described above and shown in FIGS. 1-10. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the devices described above and shown in FIGS. 1-10 to generate a Net list 980 which may contain design structures such as design structure 920. Net list 980 may comprise, for example, compiled or otherwise processed data structures representing a list of wires, discrete components, logic gates, control circuits, I/O devices, models, etc. that describes the connections to other elements and circuits in an integrated circuit design. Net list 980 may be synthesized using an iterative process in which net list 980 is resynthesized one or more times depending on design specifications and parameters for the device. As with other design structure types described herein, net list 980 may be recorded on a machine-readable data storage medium or programmed into a programmable gate array.

A machine readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the machine readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a machine readable storage medium may be any tangible medium that can contain, or store a program for use by or in connection with an instruction execution system, apparatus, or device.

Design process 910 may include hardware and software modules for processing a variety of input data structure types including Net list 980. Such data structure types may reside, for example, within library elements 930 and include a set of commonly used elements, components, assemblies and/or symbolic representations, for a given manufacturing technology. The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, DWG, Para solid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-10. In one embodiment, design structure 990 may comprise a compiled, executable HDL simulation model that functionally simulates the devices shown in FIGS. 1-10. Design structure 990 may comprise information such as, for example, symbolic data, map files, test data files, design content files, manufacturing data, layout parameters, material information files, shapes, data for routing through the manufacturing line, and any other data required by a manufacturer or other designer/developer to produce a device or structure as described above and shown in FIGS. 1-10. Design structure 990 may then proceed to a stage 995 where, for example, design structure 990 is released to manufacturing, is sent to another design or manufacturer, is sent back to the customer, etc.

Figure 12A:
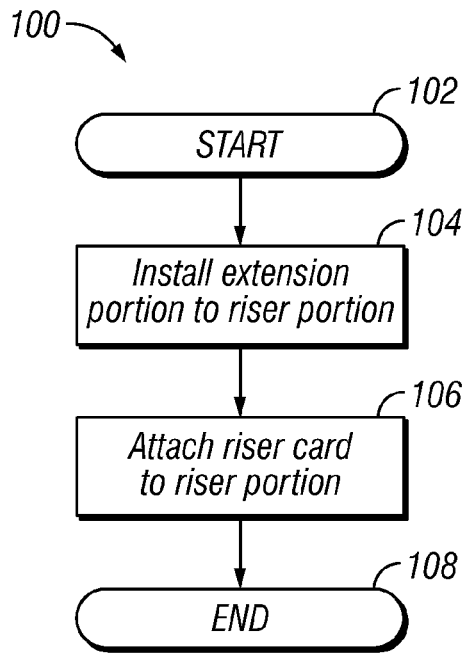
FIG. 12A depicts a method for creating an adjustable riser cage assembly, according to various embodiments of the present invention.

FIG. 12A depicts a method 100 for creating an adjustable riser cage assembly, according to various embodiments of the present invention. Method 100 begins at block 102. Extension portion 20 is installed to riser portion 10 (block 104). For example, inner guidance feature 18 engages with guidance feature 14, guidance feature 19 engages with riser base 12, etc. Riser card 50 is attached to riser portion 10 (block 106). For example, one or more fasteners may be inserted into through holes 54 and engaged with riser card mounts 26. Method 100 ends at block 108. Method 100 may be used by, for example, a PCI card manufacturer, assembler, etc.

Figure 12B:
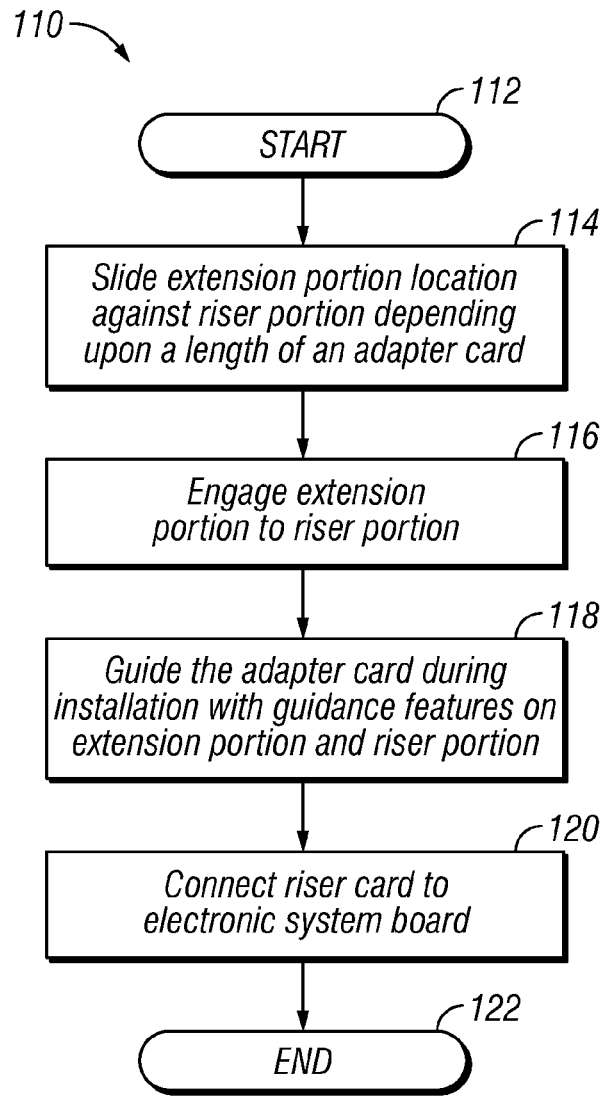
FIG. 12B depicts a method of installing an adjustable riser cage assembly into an electronic system, according to various embodiments of the present invention.

FIG. 12B depicts a method 110 of installing an adjustable riser cage assembly into an electronic system, according to various embodiments of the present invention. Method 110 begins at block 112. Extension portion 20 is slid against riser portion 10 to a particular location depending upon a length of an adapter card (block 114). For example, if a long adapter card 70 is to be supported, extension portion 20 is slid so that retention member 22 may engage with retention member 13*l*. The extension portion 20 is engaged with riser portion 10 (block 116). For example retention member 22 is engaged with the particular retention member 13. The adapter card is inserted into the adjustable riser cage assembly and is guided by a guidance feature on extension portion 20 and a guidance feature on riser portion 10 (block 118). For example, the adapter card edge 72 is guided by adapter edge engagement feature 24 and adapter tailstock foot engagement feature 15. The adjustable riser cage assembly is then installed into an electronic system 1 by connecting the riser card to the electronic system mother board 34 (block 120). For example, mother board connector 56 is inserted into riser connector 39. Method 110 may be used by, for example, an electronic system manufacturer or assembler.

The functions noted in the blocks of method 100 and method 110 may occur out of the order noted in the figures. For example, two blocks shown in succession may, in fact, be executed concurrently, or the blocks may sometimes be executed in the reverse order, depending upon the functionality involved.

The invention claimed is:

1. An adjustable riser cage configured to retain varying length adapter cards comprising:
    a riser portion comprising a riser base and a riser side surface perpendicular to an exterior surface, the riser side surface and exterior surface configured to be at least partial exterior surfaces of an electronic system chassis, the riser base comprising: one or more guidance features and a plurality of first retention members;
    an extension portion slideably supported against only the one or more guidance members, the extension portion comprising: a second retention member configured to engage with a particular first retention member depending upon a length of an adapter card.

2. The adjustable riser cage of claim 1 wherein the extension portion is slideably supported against only the one or more guidance members in two dimensions and is retained from sliding against the riser portion in a third dimension by engaging the second retention member with the particular first retention member.

3. The adjustable riser cage of claim 1 wherein the riser portion further comprises a plurality of adapter card tailstock engagement features and wherein the extension portion comprises at least one adapter card edge engagement feature.

4. The adjustable riser cage of claim 1 further comprising:
a riser card substantially parallel with the one or more guidance features of the riser portion, the riser card configured to engage with one or more adapter cards and connect to a motherboard.

5. The adjustable riser cage of claim 1 wherein the first retention members are selected from a group consisting of: threaded punch through hole, self-clinching nut, broaching nut, flaring nut, surface mount nut, weld nut, pressed in nut, and slot.

6. The adjustable riser cage of claim 1 wherein the second retention member is selected from a group consisting of: screw, captive panel screw, clinch bolt, latch, low-profile latch, spring latch, pin, and tab.

7. The adjustable riser cage of claim 1 wherein the adapter card is configured to be substantially parallel with a motherboard of the electronic system.

8. A design structure tangibly embodied in a machine readable storage medium for designing or manufacturing an adjustable riser cage, the design structure comprising:
an adjustable riser cage configured to retain varying length adapter cards comprising:
a riser portion comprising a riser base and a riser side surface perpendicular to an exterior surface, the riser side surface and exterior surface configured to be at least partial exterior surfaces of an electronic system chassis, the riser base comprising: one or more guidance features and a plurality of first retention members;
an extension portion slideably supported against only the one or more guidance members, the extension portion comprising: a second retention member configured to engage with a particular first retention member depending upon a length of an adapter card.

9. The design structure of claim 8 wherein the extension portion is slideably supported against only the one or more guidance members in two dimensions and is retained from sliding against the riser portion in a third dimension by engaging the second retention member with the particular first retention member.

10. The design structure of claim 8 wherein the riser portion further comprises a plurality of adapter card tailstock engagement features and wherein the extension portion comprises at least one adapter card edge engagement features.

11. The design structure of claim 8 wherein the adjustable riser cage further comprises:
a riser card substantially parallel with the one or more guidance features of the riser portion, the riser card configured to engage with one or more adapter cards and connect to a motherboard.

12. The design structure of claim 8 wherein the first retention members are selected from a group consisting of: threaded punch through hole, self-clinching nut, broaching nut, flaring nut, surface mount nut, weld nut, pressed in nut, and slot.

13. The design structure of claim 8 wherein the second retention member is selected from a group consisting of: screw, captive panel screw, clinch bolt, latch, low-profile latch, spring latch, and tab.

14. The design structure of claim 8 wherein the adapter card is configured to be substantially parallel with a motherboard of the electronic system.

15. A method comprising:
providing a adjustable riser cage configured to retain varying length adapter cards, the adjustable riser cage comprising:
a riser portion comprising a riser base and a riser side surface perpendicular to an exterior surface, the riser side surface and exterior surface configured to be at least partial exterior surfaces of an electronic system chassis, the riser base comprising: one or more guidance features and a plurality of first retention members;
a extension portion slideably supported against only the one or more guidance members, the extension portion comprising: a second retention member configured to engage with a particular first retention member depending upon a length of an adapter card.

16. The method of claim 15 wherein the riser portion further comprises a plurality of adapter card tailstock engagement features and wherein the extension portion comprises at least one adapter card edge engagement features.

17. The method of claim 15 wherein the extension portion is supported against only the one or more guidance members in two dimensions and is retained from sliding against the riser portion in a third dimension by engaging the second retention member with the particular first retention member.

18. The method of claim 15 further comprising:
providing a riser card substantially parallel with the one or more guidance features of the riser portion, the riser card configured to engage with one or more adapter cards and connect to a motherboard.

19. The method of claim 15 wherein the first retention members are selected from a group consisting of: threaded punch through hole, self-clinching nut, broaching nut, flaring nut, surface mount nut, weld nut, pressed in nut, and slot.

20. The method of claim 15 wherein the second retention member is selected from a group consisting of: screw, captive panel screw, clinch bolt, latch, low-profile latch, spring latch, and tab.

* * * * *